United States Patent [19]

Silverman

[11] Patent Number: 5,411,795

[45] Date of Patent: May 2, 1995

[54] ELECTROLESS DEPOSITION OF METAL EMPLOYING THERMALLY STABLE CARRIER POLYMERS

[75] Inventor: Bernard Silverman, Creve Coeur, Mo.

[73] Assignee: Monsanto Company, St. Louis, Mo.

[21] Appl. No.: 960,972

[22] Filed: Oct. 14, 1992

[51] Int. Cl.$^6$ .......................... D03D 3/00; B32B 9/00; B32B 5/16

[52] U.S. Cl. ..................... 428/229; 428/242; 428/245; 428/288; 428/294; 428/375; 428/378; 428/389; 428/902

[58] Field of Search ............... 428/373, 378, 379, 380, 428/388, 389, 263, 285, 229, 242, 245, 288, 375, 902

[56] References Cited

U.S. PATENT DOCUMENTS

| | | | |
|---|---|---|---|
| 3,370,974 | 2/1968 | Hepfer . | |
| 3,414,427 | 12/1968 | Levy . | |
| 3,423,226 | 1/1969 | Jensen | 117/47 |
| 3,437,507 | 4/1969 | Jensen | 117/47 |
| 3,507,681 | 4/1970 | Cooper | 117/47 |
| 3,515,649 | 6/1970 | Hepfer | 204/38 |
| 3,520,723 | 7/1970 | Sterman et al. | 117/236 |
| 3,616,296 | 10/1971 | Hangelar et al. | 204/30 |
| 3,702,286 | 11/1972 | Ichiki et al. | 204/30 |
| 3,847,648 | 11/1974 | Vincent et al. | 117/47 A |
| 3,930,109 | 12/1975 | Brandt et al. | 428/422 |
| 3,937,857 | 2/1976 | Brummett et al. | 427/98 |
| 3,963,841 | 6/1976 | Anschel et al. | 427/304 |
| 4,006,047 | 2/1977 | Brummett et al. | 156/656 |
| 4,675,246 | 6/1987 | Kundinger et al. | 428/379 |
| 4,738,896 | 4/1988 | Stevens | 428/378 |
| 4,808,481 | 2/1989 | Luxon | 428/378 |
| 4,900,618 | 2/1990 | O'Connor et al. | 428/328 |
| 4,910,072 | 3/1990 | Morgan et al. | 428/212 |
| 5,082,734 | 1/1992 | Vaughn | 428/411.1 |

*Primary Examiner*—James D. Withers
*Attorney, Agent, or Firm*—Thomas E. Kelley

[57] ABSTRACT

A method for electroless deposition of metal onto a nonconductive surface of a substrate is disclosed. According to the method, the surface is contacted with a nonaqueous carrier polymer mixture comprising (a) an organic solvent, (b) a catalytic compound that is soluble in the solvent and contains a catalytic metal, and (c) a polymer or polymeric precursor that is soluble in the solvent and that can be formed into a polymeric film that retains its integrity at 200° C. Excess solvent is removed from the surface to form a catalytic carrier polymer coating on the surface, the coating comprising catalytic compound adhered to a layer of carrier polymer adhered to the surface. The coating is activated to produce an activated catalytic carrier polymer coating on the surface, which is then contacted with an aqueous electroless plating mixture thereby to form a plated substrate having a film of metal over and adhered to the layer of carrier polymer. Various articles prepared by such method, and articles formed from fibers prepared by such method are also disclosed.

7 Claims, 1 Drawing Sheet

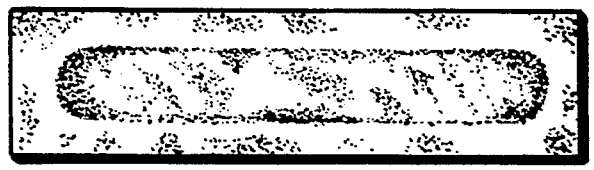
5 RATING
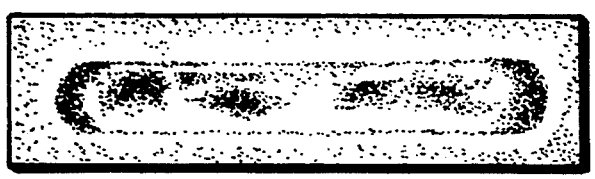
4 RATING
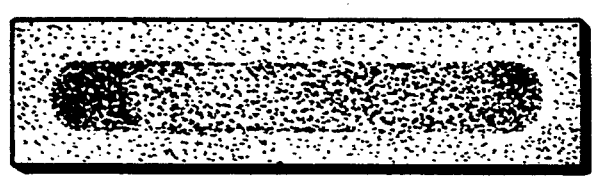
3 RATING
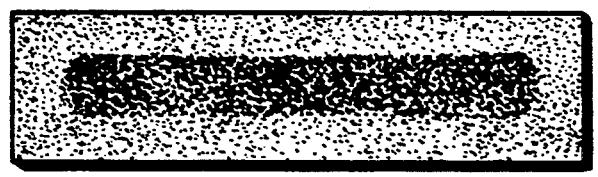
2 RATING
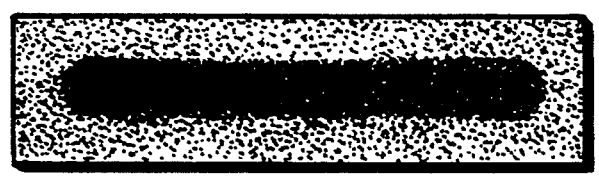
1 RATING

ELECTROLESS DEPOSITION OF METAL EMPLOYING THERMALLY STABLE CARRIER POLYMERS

BACKGROUND OF THE INVENTION

1. Field of the Invention

The present invention relates to electroless deposition of metal on surfaces where catalytic metal is supported by a carrier-polymer that can withstand high temperatures and stresses of extrusion processes and laundering.

2. Description of the Prior Art

In electroless deposition processes an article is coated with a metal film without the application of an electric current. Typically, a surface containing a noble metal such as palladium catalytically initiates deposition of a metal such as nickel, copper or cobalt from a solution containing a chemical reducing agent. Once initiated, electroless deposition is autocatalytic in that deposited reduced metal provides an expanding catalytic surface for further deposition. Such techniques are commonly used to deposit metal on plastic or resinous substrates, e.g. to produce printed circuit boards, laser or magnetic data storage devices, catalytic devices, electromagnetic shielding of electronic equipment housings, conductive coatings, decorative coatings, antistatic coatings and the like.

Considerable effort in the art of electroless depositions has been devoted to improving the quality of electrolessly-deposited metal coatings. U.S. Pat. No. 3,414,427 discloses that better adhesion of metal coatings is achieved by use of a more soluble complex, e.g., of palladium chloride, hydrogen chloride and water. Other developments based on modified palladium complexes are disclosed in U.S Pat. Nos. 3,520,723 (cuprous iodide treatment), 3,847,648 (ketopalladium complexes), 3,937,857 and 4,006,047 (thermo-decomposable palladium complexes) and 3,963,841 (dimethyl sulfoxide complexes).

Other attempts to improve metal coating adhesion have included etching of polymeric substrates, e.g., with chromic and/or sulfuric acid. See, for instance, U.S. Pat. Nos. 3,370,974; 3,423,226; 3,437,507; 3,507,681; 3,515,649; 3,616,296; and 3,702,286 which disclose various acid etching techniques which are often useful in preparing surfaces comprising ABS (a multi-phase thermoplastic of disbursed butadiene with grafted styrene acrylonitrile copolymer).

Polymers used with catalytic metal compounds in electroless deposition applications are referred to herein as "carrier polymers" in the sense that they form a polymeric coating which carries on its surface or presents the catalytic metal to the deposited metal species in the plating bath. In this regard see U.S. Pat. No. 4,910,072 for electroless deposition on substrates coated with a polymer, e.g. polybutadiene or polyvinyl chloride, complexed with a catalytic compound and activated, for example, by heating. See also U.S. Pat. No. 5,082,734 for a disclosure of electroless deposition on substrates coated with an aqueous mixture, e.g. solution or emulsion, of a polymer and a catalytic compound; exemplary coatings are prepared from solutions of water soluble polymers such as polyvinyl alcohol, modified cellulose or emulsions of water-insoluble polymers such as a polyethylene latex. Bright, shiny electroless deposition of copper is illustrated by the use of the polymers disclosed in U.S. Pat. Nos. 5,082,734 and 4,910,072 which contain only carbon and, optionally, oxygen in the backbone. The use of such polymers, however, has been found to suffer from a number of drawbacks; for instance, such polymers generally are sufficiently hydrophilic that they tend to swell and/or dissolve in the aqueous plating solution, therefore leading to incomplete metal coating and to bath "crashing". That is, some or all of the catalytic compound with or without an attendant portion of carrier polymer can be washed from the substrate surface in the agitation of the plating bath, causing depletion of the metal value of the plating bath as uncontrolled metal deposition occurs. Moreover, the limitations on the molecular structures permissible for these hydrophilic carrier polymers in turn places constraints on a number of characteristics, including thermal stability. This has been found to be a particularly undesirable characteristic when metal-coated fibers are extruded to form shaped articles, such as equipment housings.

Moreover, the requirement that the carrier polymer be suitable for aqueous application places limitations on the thermal stability of the carrier polymer since highly hydrophilic polymers soften excessively or decompose at relatively low temperatures. This has been found to be a particularly undesirable characteristic when metallized fibers are subjected to heat and shear stresses when they are incorporated into the feed mixture of an extruder or injection molding machine. Presumably, the heat and shear stresses encountered by a metal-coated fiber as it passes through a molding machine tends to soften, melt or decompose the carrier polymer thereby weakening or destroying the bond between the metal coating and the substrate. When hydrophilic polymers are used as carrier polymers, the resultant metallized fibers loose virtually all of their metal coating when they are used in injection molding feed mixtures (even when they are present at concentrations of 1 volume percent or less). It is also believed that the loss of conductivity and electromagnetic shielding that occurs when plated fabrics prepared by aqueous application of the carrier polymer are laundered is also associated with the softening of a hydrophilic polymer in the presence of water and heat.

SUMMARY OF THE INVENTION

Briefly, therefore, the present invention is directed to a novel method for electroless deposition of metal onto a nonconductive surface of a substrate. According to the method, the surface is contacted with a nonaqueous mixture comprising (a) an organic solvent, (b) a catalytic compound that is soluble in the solvent and contains a catalytic metal, and (c) a polymer or polymeric precursor that is soluble in the solvent and that can be formed into a polymeric film that retains its integrity at 200° C. Solvent is removed from the surface to form a polymeric or polymer-forming coating on the surface. The coating is typically set, cured and/or activated by heat. An activated coating presents a catalytic surface on the carrier polymer layer that is adhered to the substrate surface. When the activated coating is contacted with an aqueous electroless plating mixture, a film of metal electrolessly deposits over and adheres to an intermediate layer of carrier polymer, providing a metal-coated article.

Another aspect of this invention is directed to novel articles having a film of metal over a coating of a carrier polymer that is insoluble in water and retains its integrity at 200° C.

Still another aspect of this invention is directed to novel methods for forming extruded or injection molded articles containing metal-coated fibers which have a film of metal over a coating of a carrier polymer that is insoluble in water and retains its integrity at 200° C. By this invention a mixture comprising a polymeric molding resin and metal-coated fibers are introduced into an extruder or injection molding machine and formed into articles.

The present invention is also directed to novel methods for preparing metallized textiles, e.g. fibers and fabrics, having high surface electrical conductivity, the ability to attenuate electromagnetic radiation, good adhesion of the metal film, and retention of surface electrical conductivity after laundering.

Among the several advantages found to be achieved by the present invention, therefore, may be noted the provision of a method for electroless deposition that can utilize a wide range of thermally robust carrier polymers, including those that are insoluble in water and that maintain their integrity at elevated temperatures; the provision of such method that can produce a metal-plated article that retains its metal plating despite temperatures and shear stresses that may be encountered, for example, in extrusion and injection molding processes and laundering; the provision of such method that can be adapted to reduce the incidence of plating bath crashing.

BRIEF DESCRIPTION OF THE DRAWING

The FIGURE is a reference scale for metal adhesion ratings based on the amount of metal removed by a layer of adhesive tape after standardized rubbing under a fixed load.

DESCRIPTION OF THE PREFERRED EMBODIMENTS

As used herein a polymer is said to "retain its integrity" at a certain temperature if it does not unduly soften, melt or decompose at that temperature, e.g. during thermoprocessing. Inasmuch as a carrier polymer provides an interlayer link between a substrate and a metal coating, retention of integrity depends on the shear stress of the a metal-coated substrate at that temperature. For instance, in the case of metal-coated fibers that are employed as reinforcing agents in engineering thermoplastic applications, the temperature-stress environment is created by the thermoplastic processing and extrusion of the particular polymer e.g. polypropylene, nylon-6, polycarbonate, ABS, PVC or PET, which provides the matrix for the fibers. In this case retention of integrity of thermoplastic carrier polymers can be assured by selection of a carrier polymer having a sufficiently high Young's modulus under the thermoplastic processing conditions so as to survive the shear stress of high temperature thermoplastic processing of the matrix polymer.

The integrity of crosslinked polymers, e.g. rubbers and thermoset resins, can also be characterized by Young's modulus. The integrity of certain polymers can also be characterized by other factors such as decomposition temperature.

One class of preferred metal-coated articles of this invention are textile articles, e.g. fiber, yarn, tow, sliver, woven fabric or non-woven fabric, coated with metal such as copper, nickel, cobalt or silver. Preferred metal coated textile articles are sufficiently durable such that essentially none of the metal is removed after the article is washed for 10 minutes in 20°-30 ° C. water containing ⅛ g/l laundry detergent.

Abrasion resistance of textile fabrics is commonly determined using an A.A.T.C.C. Crockmeter Model CM1 (obtained from Atlas Electric Devices Company, Chicago, Ill.) which comprises a sandpaper-surfaced support for holding in position a piece of textile fabric located within a open-topped slotted bracket. Abrasion resistance is characterized by measuring the weight loss of the fabric caused by abrasion from the reciprocating rubbing of an acrylic finger back and forth over the fabric surface within the slotted bracket; the acrylic finger is mounted under the end of a weighted reciprocating arm.

As used herein durability of metal coated textile fabrics is determined using a modified Crockmeter where the acrylic finger is provided with a 9.5 mm (⅜ inch) diameter, flat bottomed tip under a 3.1 kilogram load which completes 50 reciprocal rubbings (i.e. 25 cycles) over the metal-coated textile fabric coated with 2 layers of adhesive tape (Highland TM 6200 permanent mending tape from 3-M Company). After the rubbing the adhesive tape is pulled from the fabric to determine the amount of metal removed from the textile by the tape as compared against standards set forth in the FIGURE of metal adhesion ratings. As shown in the FIGURE a "5 RATING" applies to a sample of very durable metal-coated textile where metal adhesion to the textile is so good that only a very slight amount of metal is removed by the adhesive tape after rubbing using the modified Crockmeter; a "4 RATING" applies where more metal is removed so that the outline of the path of the acrylic finger is barely visible; a "3 RATING" applies where sufficient metal is removed so that a distinct outline of the finger's path is clearly visible; a "2 RATING" applies where the rubbed pathway is completely filled in with metal; and a "1 RATING" applies where the path filled and metal is adhered to areas of the tape outside of the path of the finger. Samples rating substantially better than 5 are designated as "5+"; and samples rating substantially worse than 1 are rated as "1−".

The articles of this invention are produced with an electrolessly deposited metal film covering a catalytic intermediate layer of a thermally robust carrier polymer. When desirably low levels of catalytic compounds are used, the carrier polymer layer is typically catalytically inert when formed at low temperatures but catalytic when formed at higher temperatures or heated after formation. Thus, while only certain types of organic carrier polymers previously had been used, specifically, carrier polymers that contain only aliphatic carbon, olefinic carbon, and/or oxygen in the polymeric backbone, it has now been discovered that, surprisingly, the catalytic layer may be formed from a wide variety of thermally robust polymers, including those that are water insoluble and those that retain their integrity at high temperatures, e.g., 200° C. or higher. In certain cases it is preferred to use a carrier polymer that retain its integrity at 250° C. As a result, it has been discovered that electroless deposition may be carried out with a significantly reduced likelihood of bath crashing. Moreover, it has been discovered that employing thermally stable carrier polymers results in a metal coating that is less likely to be removed by heat and shear forces that may be encountered, for example, in laundering and in the formulation of shaped articles by, for example, extrusion and injection molding processes.

The methods of this invention utilize a thermally robust, water-insoluble carrier polymer. In a preferred embodiment, a substrate surface is contacted with a nonaqueous mixture comprising (1) a thermally robust carrier polymer or monomeric or oligomeric precursors thereof, (2) a catalytic compound that is soluble in the solvent and contains a catalytic metal, and (3) a nonaqueous solvent for the catalytic compound and the polymer or polymer precursors; the solvent is removed from the surface preferably by evaporation via exposure to an atmosphere with a low vapor pressure of the solvent, or heat, vacuum or a combination thereof to produce a carrier polymer coating on the surface. After treating the coating such as by heating or irradiation to activate the catalytic compound, the activated coating is contacted with a conventional aqueous electroless plating mixture containing metal ions to form a film of metal over the carrier polymer coating. In the case of monomeric and/or oligomeric polymeric precursor species, such heating and/or irradiation can promote polymerization and crosslinking beyond the level effected by solvent evaporation alone. The use of polymers that are not subject to thermal degradation or melting at a temperature of about 200° C. allows carrier polymer activation at temperatures of at least 180° C.

Carrier polymers that retain their properties at higher temperatures, e.g. at 250° C. or 300° C., can be exposed to higher temperatures for activation.

The methods of this invention are believed to be applicable to any of wide variety of substrates, including shaped articles, films, plates and textiles, e.g. fabrics and fibers. Particular benefits related to the application of the present technique to textile materials, e.g. fibers and fabrics, include the previously mentioned ability to use thermally robust polymers that solve the problem encountered in treating metal-coated fiber segments by extruding or injection molding; that is, the tendency to strip off of the metal coating from the fiber under high shear stress is reduced. In addition, the ability to use water-insoluble polymers is believed to improve the life of such articles as fabric woven from metal-coated fibers. Such articles come in to frequent contact with water in the form of perspiration, in the form of ambient water in the working environment and, especially, in the washing of the article. It is believed that when some prior art metallized fabrics, i.e. those fabricated with a water soluble carrier polymer, were exposed to water, the intermediate polymer layer, due to wicking at ends, cracks or pores, tended to swell thereby destroying the metal coating or reducing the adhesion of the coating to the substrate. Textile materials made according to this invention with metal adhered to a carrier polymer that is not water soluble will resist such destruction from shear stress or swelling.

The present method is also applicable to a wide variety of substrate compositions as well as forms. For example, glass, nylon, aramid yarns and other synthetic fibers may be plated. The substrate, i.e., the exposed surface of the article to be coated, can be contacted with a carrier polymer-forming solution using any convenient method. For instance, the substrate may be dipped into, drawn through or sprayed with a carrier polymer-forming mixture. As noted, the carrier polymer may be any of a wide variety of polymers selected according to the characteristics desired for the particular article to be coated and the application for which the article is designed. Thus, whereas it has heretofore been generally believed that an organic carrier polymer was limited to the group of polymers having only aliphatic carbon, olefinic carbon and, optionally, oxygen in the backbone, for example, polyvinyl chloride, polyvinyl acetate, polybutadiene, modified cellulose and polyethoxylated polymers, it has now been found that other polymers, even those with aromatic groups, sulfur, nitrogen or even silicon in the backbone may be employed. In more preferred aspects of this invention, the thermally robust water-insoluble polymer will also be hydrophobic, i.e. will not swell in an aqueous plating solution. Thus, the crashing of plating baths associated with the swelling or dissolving of hydrophilic polymers may be avoided. Such a thermally robust polymer is one that retains its integrity at higher temperatures than do conventional carrier polymers, i.e. at least about 200° C. Such thermally robust polymers are characterized by higher glass transition temperature than do carrier polymers used in the prior art and remain stable (that is, do not melt, soften, or decompose) at higher temperatures as do carrier polymers used in the prior art. Preferably, the glass transition temperature of the carrier polymer is at least about 200° C., generally up to about 300° C. Many commercially available polymers are sufficiently thermally robust to be useful as carrier polymers in this invention. Among them are high temperature thermoplastic polymers such as polyetherimide, e.g. ULTEM 1000 polyetherimide sold by General Electric Company, and polysulfones, e.g. VICTREX 5200 polyethersulfone sold by Imperial Chemical Industries Ltd and UDEL 3500 polysulfone sold by Amoco Company. Also useful are high temperature thermoset polymers such as those prepared from bisimides precursor, e.g. SKYBOND 3000 bismaleimide resin sold by Monsanto Company and DURIMID 100 polyimide precursor sold by Rogers Corporation. Also useful are high temperature curable elastomers such as polysiloxanes, e.g. SYLGARD 184 polydimethylsiloxane sold by Dow Corning Corporation; for instance although SYLGARD 184 polydimethylsiloxane has a glass transition temperature (Tg) below room temperature, it does not melt or degrade at temperatures below 300° C.

Useful catalytic compounds include those recognized in the prior art, typically salts of a Group 1B or Group 8 metal, preferably a palladium compound such as palladium acetate or palladium chloride. Catalytic compounds typically are inert but are activatable to a catalytic state, e.g. to be catalyze electroless deposition of a metal such as copper or nickel from conventional electroless plating solutions. The catalytic compound in/on the carrier polymer typically can be activated by radiant energy, e.g., infrared or ultraviolet radiation, laser beam, X-rays, electron beams, etc., and/or by heating the surface, conductively or radiantly.

A solvent used in the mixtures of this invention is one that solvates both the carrier polymer and/or its precursor as well as the catalytic compound at least to concentrations sufficiently high for utility in providing an activatable carrier polymer film. Thus, if the solutes, i.e. the carrier polymer and the catalytic compound, are selected, the criteria for selecting a solvent is an organic solvent that will solvate both solutes. If the solvent is selected first, the catalytic compound and carrier polymer are selected based on solubility in that solvent. Because the carrier is water-insoluble and preferably hydrophobic, the solvent is organic. Other considerations for solvent selection include toxicity and flammability. Methylene chloride and N-methyl pyrrolidone have been found to be especially suitable solvents, although other solvents, such as dimethylacetamide or diglyme (diethylene glycol dimethyl ether), may be useful. Because of its lower vapor pressure and low toxicity N-methyl pyrrolidone has been found to be superior to methylene chloride for many applications. However, in other cases, the lower boiling methylene chloride might be a superior solvent. For example, when N-methyl pyrrolidone was used as the solvent for coating polyester film and glass plates, it was found that when thin layers of catalytic solution employing such solvent were spread onto a flat substrate and heat was applied to remove the solvent, the catalytic solution tended to "bead up" on the substrate.

Use of methylene chloride as the solvent reduces "beading" a characteristic of surface tension incompatibilities. Solvent "beading" is not believed to present as great a problem if the substrate to be coated is yarn because the capillary forces between filaments diminish the tendency to bead. Diglyme was found preferable for use as a solvent for Durimid since the polymer cures to its insoluble imide form in methylene chloride.

The optimal relative proportions of the components of the carrier polymer-forming mixture depend on the particular components, the substrate to be coated and the specific technique employed for contacting the substrate with the mixture (i.e., submersion, spraying, etc.). Nonetheless, a carrier polymer-forming mixture would typically comprise from about 1 to 50 grams/liter (g/l), preferably about 7 to 20 g/l of polymer or polymeric precursor. Such mixtures also typically comprise from about 1 to 50 g/l, preferably about 5 to 20 g/l, more preferably about 10 to 30 g/l catalytic compound; the remainder of the mixture being the solvent, and optionally wetting agents.

The components and proportions of the solvent are such that during exposure of the substrate to the mixture, the viscosity of a film of the mixture is sufficiently low so as to form on the substrate a coherent carrier polymer film which, upon removal of the solvent and activation, will ultimately provide the carrier polymer layer which is catalytic for electroless deposition. Preferably, the substrate is submerged into the mixture, which is maintained. typically at ambient temperature, for a period of time appropriate to wet the substrate so that a film is retained when the substrate is withdrawn from the mixture. Excess solvent is removed, leaving a catalytic carrier polymer coating with catalytic compound adhered thereto. The catalytic compound is activated by a process such as by heating, vacuum or a combination of heating and vacuum, as needed, to produce a uniform, coherent active catalytic layer for the initiation of electroless plating.

Activation of the film derived from the carrier polymer-forming solution thus provided on the surface of the substrate can be achieved by a process such as heating at about 160° C. to about 285° C. for about 10 minutes to about an hour, preferably about 10 minutes to about 30 minutes. Alternatively, activation may be accomplished by ramping, for example, from 160° C. to 260° C. over an hour, and maintaining the coated article at the end point temperature for about 10 minutes.

The conditions of activation have been found to be critical to the formation of an effective surface for plating. In particular, it has been discovered that the activation time and temperature must fall within a relatively narrow range. If the time or temperature of activation is too low or too high, the film of dried carrier polymer and catalytic compound is not an effective catalyst for electroless deposition. For example, it has been found that an effective continuous system for plating a 1000 filament yarn using an N-methyl pyrrolidone-based carrier polymer solution containing 10 g/l of VICTREX 5200 polysulfone and 10g/l of palladium acetate dihydrate involves activation at 160° C. for ten minutes. Particular ranges of time and temperature for each substrate/carrier polymer/catalytic compound/solvent system may be determined on a case by case basis by plating small samples such as small plaques or fibers.

The substrate bearing the activated catalytic coating is then contacted with a metal plating mixture such as any of the commercial electroless metal plating solutions. Thus, the substrate may be submersed in a metal plating bath, such as a copper, nickel, gold, rhodium or palladium bath pursuant to conventional techniques. A metal layer of sufficient thickness to provide complete surface coverage and exceptably low resistance values dictates the particular metal plating conditions in view of the type of substrate, substrate composition and desired use for the coated plated substrate. For example, for copper plated fibers and plaques, it has been found that a copper thickness of from about 0.2 microns to about 0.4 microns is usually preferred. For polyaramid fiber, it has been found that about 72 to 90 weight percent of copper based on uncoated fiber is usually desirable. Generally, metal films formed by the techniques have been found to be bright and shiny.

After plating, the substrate may then be employed in any of a number of desired fashions. For example, where the substrate is a molded electronic equipment housing, it may be employed directly in its end use. Plated fiber may be woven to form a textile article or the textile article may be coated and plated directly by the present technique. Plated fiber may also be used to form an extruded or injection molded products; for instance plated fiber can be chopped and processed through extruders or injection molding machines with an engineering thermoplastic polymer such as polyamides like nylon-6, nylon-66 or nylon 12, polycarbonate, polyester like PET, PBT or PETG, polyolefin like polypropylene, grafted rubber thermoplastics like ABS, styrenics like polystyrene or styrene-acrylonitrile copolymer (SAN) and thermoplastic elastomers. Plated textiles have been found to be of superior quality when coated and plated by the present technique. In particular, it has been found that the use of a water insoluble carrier polymer imparts to the textile greater plating retention through repeated washings or other exposure to water. In addition, the greater flexibility in selecting carrier polymers permits selection of polymers which provide greater wear resistance. The textile fabrics have been found to be of superior quality in a number of respects. Such fabrics having a surface resistivity, of no more than 0.3 ohms per square and that maintain sufficient conductivity after three wash cycles to have a surface resistivity of no more than about 0.5 ohms per square have been produced. Moreover, such fabrics have been found to have an abrasion resistance of at least about 4 to provide at least about 60 decibels of attenuation in a near field electrical field.

If the plated fibers are to be chopped and employed in an injection molding or extrusion process, standard techniques may be employed. Thus, the yarn or other fiber may be chopped into, for example, 3/16" lengths and coated with a molding resin polymer like SAN. The fibers may then be mixed with the rest of the molding composition, such as ABS pellets and other components, if desired, such as a lubricant.

The following examples describe preferred embodiments of the invention. Other embodiments within the scope of the claims herein will be apparent to one skilled in the art from consideration of the specification or practice of the invention as disclosed herein. It is intended that the specification, together with the examples, be considered exemplary only, with the scope and spirit of the invention being indicated by the claims which follow the examples. In the examples all percentages are given on a weight basis unless otherwise indicated.

EXAMPLE 1

A methylene chloride solution containing 10 g/l of ULTEM 1000 polyetherimide (sold by General Electric Company) and 5 g/l of palladium acetate dihydrate, $Pd(OAc)_2.2H_2O$, was prepared. A layer of the solution was spread on a glass plaque with a doctor blade having a 25 micrometer (1 mil) clearance. The methylene chloride (MC) evaporated within a few seconds. The coated plaque was then held for 30 minutes in an oven that had been preheated to a temperature of 285° C. The coated and heat treated plaque was then immersed for about 12 minutes in a commercial copper plating bath (Macedep 54 copper bath from MacDermid Inc.) containing primarily copper sulfate, formaldehyde and EDTA (molar ratio EDTA/Cu=2/1) and having a pH of about 12.5 at 4° C. The plaque plated with bright, shiny uniform copper.

EXAMPLE 2

A coated plaque was prepared as described in Example 1, above, except that the solution contained 3 g/l palladium acetate dihydrate and then was placed in an oven that had been preheated to 160° C. and the oven temperature ramped from 160° C. to 205° C. over a period of one hour and held at 205° C. for 10 minutes. Only trace plating resulted from immersion of the plaque in a commercial copper plating bath for 10 minutes at 4° C.

EXAMPLE 3

Three coated plaques were prepared as described in Example 1, above, except that the methylene chloride solution contained 5 g/l of palladium acetate dihydrate. The coated plaques were heated in an oven that had been preheated to 300° C., one of the coated plaques for 10 minutes, one for 30 minutes and one for 60 minutes. Upon immersion of the plaques in commercial copper plating solutions for 12 minutes at 4° C., plating resulted on the plaques that had been heated for 10 minutes and for 30 minutes, but trace plating resulted on the plaque that had been heated for 60 minutes.

EXAMPLE 4

A methylene chloride solution containing 10 g/l of ULTEM 1000 polyetherimide and 5 g/l of palladium acetate dihydrate was prepared. A moving threadline of a 1000 filament TWARON 1001 aramid yarn (sold by Akzo) was pulled through the solution and then through a 255° C. oven (30 minute residence time). Upon emergence from the oven, the fiber was taken up on a winder. On immersion in a commercial copper plating bath for 10 minutes at 23° C., the fiber plated with bright, shiny uniform copper.

EXAMPLE 5

A methylene chloride solution containing 10 g/l of VICTREX 5200 polysulfone (sold by ICI) and 3 g/l of palladium acetate dihydrate was prepared. A layer of the solution was spread on a glass plaque with a doctor blade having a 25 micrometer clearance. The coated plaque was placed in an oven that had been preheated to 160° C. and the oven temperature then ramped from 160° C. to 205° C. over a period of an hour and held at 205° C. for 10 minutes. The coated and heat treated plaque was then immersed in a commercial copper plating bath for 8 minutes at 5° C. The plaque plated with bright, shiny uniform copper.

EXAMPLE 6

Two coated plaques were prepared as described in Example 5, above, except that the methylene chloride solution contained 1 g/l) of palladium acetate dihydrate instead of 3 g/l. Then, the coated plaques were heated for 10 minutes in a preheated oven, one at 160° C. and the other at 220° C. Immersion of the plaques in commercial copper plating baths for 4 minutes at 23° C. did not result in plating of either plaque.

EXAMPLE 7

The procedures described in Example 6, above, was followed with two other glass plaques, except that the methylene chloride solution contained 5 g/l of palladium acetate dihydrate instead of 1 g/l and the plating bath was at 22° C. instead of 23° C. The plaque heated at 220° C. plated with bright, shiny uniform copper. Only trace plating occurred on the plaque heated to 160° C.

EXAMPLE 8

A short length of TWARON 1001 aramid yarn was immersed in an N-methyl pyrrolidone (NMP) solution containing 1 g/l of VICTREX 5200 polysulfone and 1 g/l of palladium acetate dihydrate and the excess solution was removed by pulling the yarn between a thumb and forefinger. The yarn then was heated at 163° C. for 10 minutes in an oven that had been preheated to 163° C. On immersion in a commercial copper plating bath for 2 minutes at 35° C., the yarn plated with bright, shiny uniform copper. It is possible that the polymer on the yarn still contained some N-methyl pyrrolidone (which has a boiling point of 204° C.) at the conclusion of the activation process.

EXAMPLE 9

A methylene chloride solution containing 10 g/l of UDEL 3500 polysulfone (sold by Amoco) and 5 g/l of palladium acetate dihydrate was prepared. A layer of the solution was spread on a glass plaque with a doctor blade having a 25 micrometer clearance. The methylene chloride evaporated within a few seconds. The coated plaque was placed in an oven that had been preheated to 160° C. and the oven temperature then ramped from 160° C. to 205° C. over a period of one hour and held at 205° C. for 10 minutes. The plaque plated with bright, shiny uniform copper upon immersion for 12 minutes in a 2° C. copper plating bath.

EXAMPLE 10

A diglyme solution containing 20 g/l of solids added as a DURIMID 100 polyimide precursor solution (sold by Rogers Corporation) and 5 g/l of palladium acetate dihydrate was prepared. A layer of the solution was spread on a glass plaque with a doctor blade having a 25 micrometer clearance. The coated plaque then was ramped from 22° C. to 300° C. over a period of an hour and held at 300° C. for 10 minutes. The plaque was then immersed in a commercial copper plating bath for 12 minutes at 4° C. The plaque plated with bright, shiny uniform) copper.

EXAMPLE 11

A methylene chloride solution containing 12 g/l of SKYBOND 3000 bismaleimide resin (sold by Monsanto Company) and 3 g/l of palladium acetate dihydrate was prepared. A layer of the solution was spread on a glass plaque with a doctor blade having a 25 micrometer clearance. The methylene chloride evaporated within a few seconds. The coated plaque then was heated for 30 minutes at 300° C. in an oven that had been preheated to 300° C. The plaque was then immersed in a commercial plating bath for 10 minutes at 4° C. The plaque plated with bright, shiny uniform) copper.

EXAMPLE 12

A methylene chloride solution containing 125 ml/l of isopentane, 2.5 g/l of a polysiloxane added as SYL-GARD 184 polydimethylsiloxane (sold by Dow Corning Corp) and 5 g/l of palladium acetate dihydrate was prepared. A layer of the solution was spread on a glass plaque with a doctor blade having a 25 micrometer clearance. The solvents evaporated within a few seconds. The coated plaque then was heated for 20 minutes at 160° C. About 10% of the plaque plated with shiny copper upon immersion of the plaque in a commercial copper plating bath for 12 minutes at 5° C.

EXAMPLE 13

Twaron 1000 filament aramid yarn was plated using continuous catalyst solution application and activation (followed by batch plating). The surfaces of the filaments plated with shiny, uniformly deposited copper. The fibers were treated with polymer solutions in accordance with the type of procedure described in Examples 1–12, and then heated under conditions as set forth in the following table, wherein MC stands for methylene chloride and NMP stands for N-methyl pyrrolidone:

| Polymer | Pd (OAc)$_2$ · 2H$_2$O (g/100 ml) | Solvent | Activation Conditions |
|---|---|---|---|
| 1% ULTEM 1000 | 0.5 | NMP | 250° C., 10 min. |
| 1% VICTREX 5200 | 0.5 | MC | 200° C., 10 min. |
| 1% VICTREX 5200 | 1.0 | NMP | 160° C., 10 min. |
| 1% UDEL 3500 | 0.5 | NMP | 200° C., 10 min. |
| 1% DURIMID 100 | 1.0 | NMP | 255° C., 30 min. |
| 1% SKYBOND 3000 | 0.3 | NMP | 250° C., 10 min. |

The thickness of the metal layers on these fibers were calculated as being in the range of 0.075 to 0.15 micrometers, based on the weight of copper deposited in 10 minutes at a plating bath temperature of 23° C.

EXAMPLE 14

Two samples of plated 1000 filament TWARON 1001 aramid yarn, weighing 0.17 g/m prior to the plating, were prepared using continuous activation and plating processes. One sample was contacted with a an N-methyl pyrrolidone solution containing 10 g/l of VICTREX 5200 polysulfone and 10 g/l of palladium acetate dihydrate and activated at 160° C. for ten minutes. The other sample was contacted with a an N-methyl pyrrolidone solution containing 10 g/l of SKYBOND 3000 bismaleimide resin and 10 g/l of palladium acetate dihydrate and activated at 255° C. for ten minutes. The samples were then copper plated for 10 minutes at 23° C.

The linear electrical resistances of the plated yarns were about twice the linear electrical resistance of a meter of copper wire whose mass was the same as the mass of the copper plated on a meter of the aramid yarn. For the VICTREX polysulfone carrier polymer, the weight of copper plated on the yarn was 105% of the weight of the unplated yarn and that yarn had a resistance of 1.7 ohms per meter. For the SKYBOND bismaleimide carrier polymer, the weight of copper plated on the yarn was 55% of the weight of the unplated yarn and that yarn had a resistance of 3.5 ohms per meter.

EXAMPLE 15

Twelve hundred meters of 1000 filament TWARON 1001 aramid yarn was coated with a solution of VICTREX 5200 polysulfone and activated as described in Example 14, above, and plated with copper by means of a continuous process for both coating/activation and plating. A 28 minute residence time in the 28° C. plating solution resulted in 82% by weight copper plating based on the weight of the core fiber and a copper layer of 0.40 micron average thickness. All filaments appeared to be uniformly plated with shiny copper. The plated yarn was then heated in a vacuum oven at 125° C. for two hours to ensure that all N-methyl pyrrolidone was removed. The plated yarn was then plied into a 3000 filament yarn. In order to hold the filaments together after chopping, the plated 3000 filament yarn was coated with SAN 31 styrene-acrylonitrile copolymer (SAN 31 from Monsanto Company) by drawing the plated yarn through an acetone solution of 75 g/l of and drying the yarn. The resulting SAN content was 22.6% by weight, based on the weight of the plated fiber. The yarn was chopped into 5 millimeter (3/16 inch) lengths.

EXAMPLE 16

As a preliminary investigation, proper molding conditions were determined for obtaining a good dispersion of Bekaert GR 75/C10/4 stainless steel fiber at 0.75, 1 and 2 volume percent in ABS polymer (Lustran Elite ABS from Monsanto Company). Then, a sample of the chopped fiber of Example 15, above, was mixed with ABS pellets for injection molding. A series of sample plaques containing 1 and 2 volume percent of the plated aramid was injection molded under a range of shear conditions ranging from the mild shear conditions used with the stainless steel fiber to much harsher shear conditions (achieved by increasing back pressure, screw rpm and injection rate). While the degree of fiber dispersion was a function of the severity of the shear conditions, none of the plaques showed the dark brown pigmentation color associated with major loss of copper from the surface of the plated fibers. Samples were cut from the plaques made with aramid fiber and the ABS polymer was dissolved with acetone. The recovered fibers were highly conductive. Microscopic examination of the fibers indicated that even the fibers in the plaque subjected to the highest shear during molding retained copper over more than 90% of their surface area.

EXAMPLE 17

Samples of plated aramid fibers from Example 15, above, were processed with ABS in more intensive mixing equipment than utilized in Example 16, above. Compounding of 2 to 3.5 volume percent of the fiber was conducted in a 60 ml Banbury head on a Brabender Plasticorder and on a small twin screw extruder. The compounded material showed that the five millimeter initial lengths of aramid core fiber (a fiber so strong that it is used in bullet-proof vests) was broken into very short lengths (less than 1 mm) with a loss of copper from less than 25% of the surface area of the fiber and that there was a good dispersion of the fiber in the ABS.

EXAMPLE 18

Aramid and graphite fabrics were plated by similar procedures employed to plate aramid fiber. The carrier polymer solution contained 10 g/l of VICTREX 5200 polyethersulfone and 10 g/l of palladium acetate dihydrate in N-methylpyrrolidone and the activation conditions were 160° to 200° C. for 10 minutes.

EXAMPLE 19

In the following examples fabrics are characterized by density where 34 g/m$^2$ is equivalent to 1 ounce/square yard (opsy). Samples of the following fabrics: light (34 g/m$^2$) nylon woven ripstop fabric, light (58 g/m$^2$) and heavy (136 g/m$^2$) KEVLAR polyaramide woven fabric, and light (34 g/m$^2$) CEREX nylon nonwoven fabric were catalyzed with a solution containing 10 g/l of VICTREX 5200 polysulfone and 10 g/l of palladium acetate dihydrate in N-methylpyrrolidone, allowed to drain until the excess solution stopped dripping off the fabric, and placed in a vacuum oven (130° C., 56 Torr.) for 30 minutes. Upon emersion in the plating solution, copper was deposited on each sample.

EXAMPLE 20

Samples of the following fabrics: light (58 g/m$^2$) and heavy (136 g/m$^2$) KEVLAR polyaramide woven fabric, light (34 g/m$^2$) KEVLAR polyaramide non-woven fabric, heavy (120 g/m$^2$) NOMEX polyaramide woven fabric and light (34 g/m$^2$) CEREX nylon nonwoven fabric were catalyzed and plated as in Example 19, above and run through 3 wash cycles. As prepared, the fabrics were uniformly plated with bright, shiny copper, had a surface resistivity of less than 0.3 ohms/square, had an abrasion resistance of 4-5 as measured by the test described earlier, and provided over 60 decibels of nearfield shielding in a electrical field. Samples of each fabric retained a surface resistance of 0.5 ohms/square or less after 3 wash cycles. A wash cycle consisted of placing a single 10 cm×15 cm (4 inch×6 inch) fabric sample in a one liter washing pot of a Model 7243 Turg-0-Tometer (produced by the United States Testing Company Inc., Hoboken, N.J.); adding one liter of water containing 1.86 grams of ERA liquid detergent (Proctor and Gamble); and washing for ten minutes at a temperature of 22° C. After each wash cycle the sample was rinsed with cold water and dried in a clothes drier for five minutes at a low heat setting.

In view of the above, it will be seen that the several advantages of the invention are achieved and other advantageous results attained.

As various changes could be made in the above methods and compositions without departing from the scope of the invention, it is intended that all matter contained in the above description shall be interpreted as illustrative and not in a limiting sense.

What is claimed:

1. A metallized textile article comprising a substrate coated successively with a polymer layer and a metal layer wherein said polymer layer comprises palladium and a water-insoluble organic polymer which maintains its integrity at 200° C., said polymer selected from the group consisting of polysulfones, polyetherimides, polyimides and polysiloxanes, and wherein said metal layer comprises electrolessly deposited metal providing said article with a surface resistivity of at most about 0.3 ohms/square.

2. An article as set forth in claim 1 wherein the substrate is a fiber or yarn.

3. An article as set forth in claim 1 wherein the substrate is a textile fabric having an abrasion resistance of 4 or more.

4. An article as set forth in claim 1 wherein the substrate is a textile fabric that provides at least about 60 decibels of attenuation in a nearfield electrical field.

5. An article as set forth in claim 1 wherein the substrate is a textile fabric having a surface resistivity of at most about 0.5 ohms/square after 3 wash cycles.

6. A shaped article comprising fibers dispersed in an article-forming polymer, wherein said fibers have a film of metal over a coating of an organic carrier, said carrier polymer selected from the group consisting of polysulfones, polyetherimides, polyimides and polysiloxanes, and wherein said article was formed by extrusion or injection molding.

7. A shaped article according to claim 6 wherein said fibers are aramid fibers.

* * * * *